(12) United States Patent
Hsieh

(10) Patent No.: US 11,373,847 B2
(45) Date of Patent: Jun. 28, 2022

(54) PLASMA TREATMENT METHOD

(71) Applicant: Industrial Technology Research Institute, Hsinchu (TW)

(72) Inventor: Hung-Yuan Hsieh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 480 days.

(21) Appl. No.: 16/664,925

(22) Filed: Oct. 27, 2019

(65) Prior Publication Data
US 2020/0058476 A1   Feb. 20, 2020

Related U.S. Application Data

(62) Division of application No. 15/851,662, filed on Dec. 21, 2017, now Pat. No. 10,504,703.

(30) Foreign Application Priority Data

Dec. 29, 2016  (TW) ................. 105143813

(51) Int. Cl.
    *H01J 37/32* (2006.01)
    *H01J 37/244* (2006.01)
    *H01J 37/22* (2006.01)
    *C23C 16/50* (2006.01)
    *C23C 16/52* (2006.01)
    (Continued)

(52) U.S. Cl.
    CPC ........ *H01J 37/32935* (2013.01); *B05D 3/141* (2013.01); *B05D 3/142* (2013.01); *C03C 23/006* (2013.01); *C23C 16/50* (2013.01); *C23C 16/52* (2013.01); *H01J 37/22* (2013.01); *H01J 37/244* (2013.01); *H01J 37/3299* (2013.01); *H01J 37/32449* (2013.01); *H01J 37/32541* (2013.01); *H01J 37/32733* (2013.01); *H01J 37/32917* (2013.01); *H01J 37/32972* (2013.01); *C23C 16/04* (2013.01); *C23C 18/1605* (2013.01);
    (Continued)

(58) Field of Classification Search
    None
    See application file for complete search history.

(56) References Cited

U.S. PATENT DOCUMENTS

2005/0009347 A1 * 1/2005 Matsumoto ....... H01J 37/32174
                                                   257/E21.252

OTHER PUBLICATIONS

R. Yang and R. Chen, Real-Time Plasma Process Condition Sensing and Abnormal Process Detection, Sensors, vol. 10, pp. 5703-5723. (Year: 2010).*

* cited by examiner

Primary Examiner — Jiong-Ping Lu
(74) Attorney, Agent, or Firm — JCIPRNET

(57) ABSTRACT

A plasma treatment method is provided. The method includes generating a planar plasma in a plasma treatment chamber, observing an effective influence region of the planar plasma by using an optical observation system in which an observation lens has a transparent substrate and a fluorescent coating thereon, adjusting a location of the observation lens to observe a brightness change of the fluorescent coating and the transparent substrate to obtain a location and a thickness range of the effective influence region of the planar plasma, and then adjusting a location of the observation lens to observe a brightness change of the fluorescent coating and the transparent substrate to obtain a location and a thickness range of the effective influence region of the planar plasma. A location of a sample is adjusted to within the effective influence region, and a plasma treatment is then performed on the sample.

14 Claims, 12 Drawing Sheets

(51) Int. Cl.
  *B05D 3/14* (2006.01)
  *C03C 23/00* (2006.01)
  *C23C 18/38* (2006.01)
  *C23C 18/16* (2006.01)
  *C23C 16/04* (2006.01)
  *C23C 18/20* (2006.01)
(52) U.S. Cl.
  CPC ........ *C23C 18/206* (2013.01); *C23C 18/2006* (2013.01); *C23C 18/38* (2013.01)

PLASMA TREATMENT METHOD

CROSS-REFERENCE TO RELATED APPLICATION

This application is a divisional application of and claims the priority benefit of U.S. patent application Ser. No. 15/851,662, filed on Dec. 21, 2017, now allowed. The prior application Ser. No. 15/851,662 claims the priority benefit of Taiwan application no. 105143813 filed on Dec. 29, 2016. The entirety of each of the above-mentioned patent applications is hereby incorporated by reference herein and made a part of this specification.

TECHNICAL FIELD

The disclosure relates to a plasma treatment method.

BACKGROUND

The metallization of a non-conductor generally requires a catalyst to be placed beforehand on the surface of the non-conductor, and coating metal is triggered to be deposited at the location of the catalyst in an electroless (chemical plating) plating solution. Normally catalysts such as tin palladium (Sn—Pd) colloid do not adhere to a hydrophobic surface, which then requires hydrophilic modification for the substrate surface to be plated. For instance, a glass substrate may be thoroughly cleaned in a strong acid, or a polymer substrate needs to be soaked in a high-temperature solution of caustic soda for a certain period of time. Not only are these processes time-consuming and complicated in nature, the strong acids and strong bases are dangerous, which raises many health and safety concerns for those performing the processes as the materials must be handled in an environment equipped with a smoke venting cabinet.

A relatively effective method for hydrophilic or hydrophobic property modification of the substrate surface is using plasma, such as capacitance-coupled plasma (CCP) in which a sample is placed in a reaction chamber. However, since the volume of the reaction chamber is large, it requires a long period of time to pump out air for getting a sufficiently low pressure, and therefore consumes great amount of energy. Moreover, such manner of treatment lacks selectivity of surface to be treated. Another configuration of CCP is parallel-plate CCP, wherein the sample is placed between two parallel electrodes thus resembling a sandwich configuration. However, for both of the above configurations, the bombardment of plasma all directly occurs on the treated surface may be resulting in etching or undesired roughening of the surface which sometimes might not be tolerated for certain applications.

In case a process of electrochemical plating on a non-conductive substrate requires patterning, then a catalyst must be patterned beforehand. A subtractive method such as masking with an adhesive tape might quickly met the patterning need, but most tapes withstand only short periods of soaking in an alkaline solution and such a method is incapable of providing a fine resolution. Therefore, to develop a technique which effectively modify functional-group properties on an object surface at room temperature is needed.

SUMMARY

A plasma treatment method of the disclosure includes generating a planar plasma in a plasma treatment chamber and obtaining the location and thickness information of an effective influence region of the planar plasma by observing through an optical observation system. The optical observation system includes at least an observation lens, and the observation lens includes a transparent substrate, a fluorescent coating located on a surface of the transparent substrate, and a shelter coating between the transparent substrate and the fluorescent coating. The location of the observation lens is then adjusted to observe a brightness change of the fluorescent coating and the transparent substrate for obtaining the location and the thickness range of the effective influence region of the planar plasma. The location of the sample is adjusted to within the effective influence region before the plasma treatment.

Based on the above, in the disclosure, a planar plasma is generated using coplanar dielectric barrier discharge, and under suitable buffer gas conditions (gas type, gas supply pressure, and flow), a suitable reaction influence region can exist at a distance above the coplanar electrodes for rapid and effective modification on a surface facing the electrodes, i.e., reactions such as cleaning and grafting. Based on this feature, hydrophilicity and hydrophobicity may be effectively modified on the surface. Therefore, the disclosure is different in that the treatment substrate is not entirely immersed in a gas plasma, and the treatment surface may be selected, or a mask may be added to only modify parts of the surface to create hydrophilic and hydrophobic properties with patterning differentiation resulting in more effectively utilize plasma energy.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 3A-1 is a side view of the optical observation system of FIG. 2A below an effective influence region range of a planar plasma.

FIG. 3A-2 is a top view of the optical observation system of FIG. 2B below an effective influence region range of a planar plasma.

FIG. 3B-1 is a side view of the optical observation system of FIG. 2A in an effective influence region range of a planar plasma.

FIG. 3B-2 is a top view of the optical observation system of FIG. 2B in an effective influence region range of a planar plasma.

FIG. 3C-1 is a side view of the optical observation system of FIG. 2A over the top of an effective influence region range of a planar plasma.

FIG. 3C-2 is a top view of the optical observation system of FIG. 2B over the top of a planar plasma effective influence region range.

DETAILED DESCRIPTION OF DISCLOSED EMBODIMENTS

Figure 1:
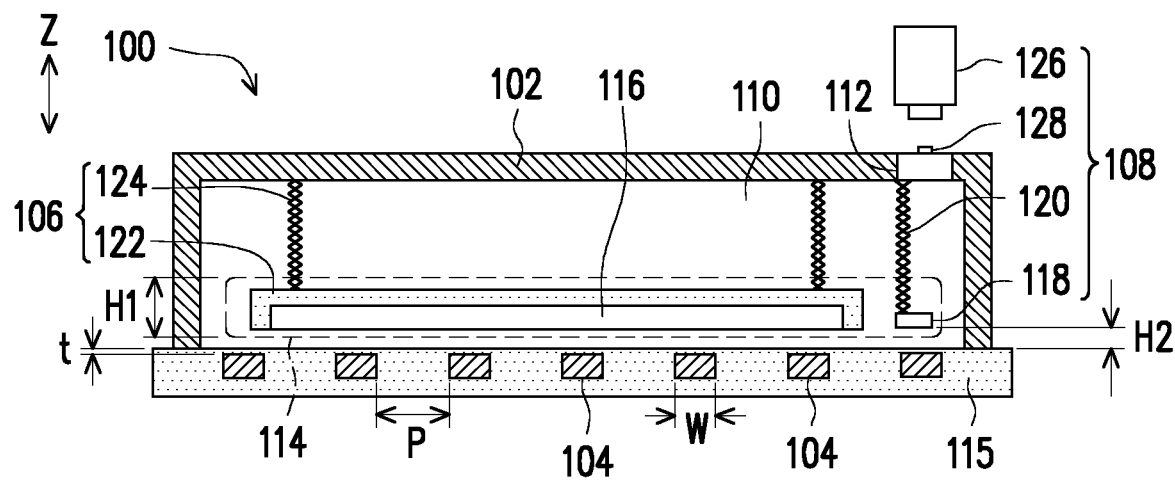
FIG. 1 is a schematic of a plasma treatment apparatus according to the first embodiment of the disclosure.

FIG. 1 is a schematic of a plasma treatment apparatus according to the first embodiment of the disclosure. Referring to FIG. 1, a plasma treatment apparatus 100 of the first embodiment includes a chamber 102, a planar plasma-generating electrode 104, a sample suspension and holding system 106, and an optical observation system 108. The chamber 102 defines a processing inner chamber 110, and the top portion of the chamber 102 has a window 112. The planar plasma-generating electrode 104 is located in the processing inner chamber 110 for generating an effective influence region 114 of the planar plasma, and the planar plasma-generating electrode 104 may be embedded in an insulating substrate 115 as shown in the figure, or adhered on the insulating substrate 115 and above the surface of the insulating substrate 115. The planar plasma-generating electrode 104 may be made the same size as or bigger than the sample 116 to perform an overall treatment. Alternatively, the planar plasma-generating electrode 104 may be made into various geometric shapes smaller than the sample 116 so as to only perform treatment on certain specific and continuous portion of the sample 116. The sample suspension and holding system 106 is disposed opposite to the planar plasma-generating electrode 104 in the processing inner chamber 110 to suspend and hold the sample 116. The optical observation system 108 is located in the processing inner chamber 110 adjacent to the sample suspension and holding system 106 to measure a range of the effective influence region 114 (i.e. thickness H1 range of the effective influence region 114) of the planar plasma through the window 112 of the chamber 102 in the thickness direction (z direction) (as shown in FIG. 1). The optical observation system 108 can move above the planar plasma-generating electrode 104 in a range of about 20 mm and has the function of resetting and measuring (or displaying and recording) vertical distance. The optical observation system 108 and the sample suspension and holding system 106 may be linked, or the optical observation system 108 is unlinked from the sample suspension and holding system 106 to move independently by itself. For instance, the optical observation system 108 can have an observation lens 118 and an adjustable suspension member 120 connected to the observation lens 118; and the sample suspension and holding system 106 can have a clamping member 122 and another adjustable suspension member 124 connected to the clamping member 122. Therefore, by individually controlling (manually or electrically) the adjustable suspension member 120 or 124, the optical observation system 108 and the sample suspension and holding system 106 may be not linked; by controlling the adjustable suspension members 120 and 124 at the same time, the optical observation system 108 and the sample suspension and holding system 106 may be linked. When not linked, the optical observation system 108 is purposed to be used for measuring the upper and lower limits of a thickness H1 range of the effective influence region 114 of the planar plasma, but cannot indicate an elevation or position information of the suspending sample instantly. On the other hand, when linked together, the optical observation system 108 can instantly confirm by observation whether the sample is located between the upper and lower limits of the effective influence region 114 thickness H1 of the planar plasma during the treatment process. Moreover, the optical observation system 108 can further be used with a digital photography apparatus (such as a charge-coupled device (CCD)) disposed outside the chamber 102 opposite to the window 112 and a fiber optic sensor 128 located in the window for transmitting an optical signal to an external analysis equipment (not shown).

The different regions of the planar plasma are described below.

First, the generation of planar plasma may be divided into inductance-coupled plasma (ICP) and capacitance-coupled plasma (CCP), and both generation methods are suitable for treatments of an object surface (particularly a flat surface), such as hydrophilic and hydrophobic modification.

The ICP can adopt a single continuous planar plasma-generating electrode 104. Since FIG. 1 shows a cross section of the plasma treatment apparatus 100, the planar plasma-generating electrodes 104 appear as separated from one another, but actually may be a single piece of continuous electrode shaped like, for example, a spiral (not shown). Free electrons are accelerated by the coupling-induced electric field provided by the planar plasma-generating electrode 104 to excite the gas in a low-pressure state within the processing inner chamber 110 to generate electrostatic-coupled E discharge for generating a planar plasma. At the same time, the density of the free electrons is increased, and when the density reaches a certain critical point, the discharge reaction is dictated by an electromagnetic-coupled H discharge effect, and the induced electric field accelerates electron movement in a vortex in a certain direction to further accelerate the discharge phenomenon and discharge a large number of electrons. The plasma appearing on the planar plasma-generating electrode 104 may be roughly divided into the two segments which compose of an invalid plasma region and an effective influence region 114 labeled in FIG. 1 represents the effective influence region of the planar plasma. The thickness of the effective influence region is shown by H1 of FIG. 1. Outside the effective influence region, a balance of the plasma cannot be sustained due to short of sufficient excited electrons. Such a region is therefore classify as an "invalid" region. The invalid region consists of a "beyond plasma" region above the effective influence region and a plasma sheath region down below. The planar plasma-generating electrode 104 may be configured as a square loop or a circular loop. The planar plasma-generating electrode 104 can also be a U-line, a serpentine line, an S-line, or multiple lines connected in parallel to generate various configurations of ICP. The plasma treatment apparatus 100 in the present embodiment can treat the sample 116 that is larger or smaller than the coil of the planar plasma-generating electrode 104, i.e., the energy transfer coil on the electrode carrier plate may be made the same size as or larger than the sample for an overall treatment, and the energy transfer coil can also be made smaller than the various geometric shapes of the sample to only perform modification on certain specific and continuous range of the sample. The planar plasma-generating electrode 104 is made of, for instance, a copper metal, sintered silver adhesive thick film, sintered Pd adhesive thick film, or transparent conductive oxide such as indium tin oxide (ITO), and each line segment of the above can have a spacing P between 0.1 mm and 5.0 mm and a linewidth W between about 0.1 mm and 10 mm, but the disclosure is not limited thereto.

Capacitance-coupled plasma (CCP) refers to accelerating free electrons by the coupling-induced electric field provided by the anode and the cathode of the planar plasma-generating electrode 104. Such an electric field rapidly oscillates the free electrons back and forth between two parallel electrodes to excite a gas in a low-pressure state in the processing inner chamber 110 to generate an electrostatic-coupled discharge to form the planar plasma 114, and to increase the density of the free electrons at the same time. In the present embodiment, two parallel electrodes are arranged on the same plane to form a coplanar discharge configuration. The plasma appearing on the planar plasma-generating electrode 104 may be roughly divided into two segments of invalid plasma region and, in between, an effective influence region. As labeled H1 of the planar plasma in FIG. 1 is the thickness of the "effective influence region" 114 Outside the effective influence region, there are a "plasma sheath" region down below, and a far above "beyond plasma" region, for both a balance of the plasma cannot be sustained for lack of a sufficient excited electrons, so as to be classified both as "invalid" regions. The planar plasma-generating electrode 104 can refer to a comb-like electrode possessing a configuration of opposite polarity. The planar plasma-generating electrode 104 may be made of copper metal, sintered silver adhesive thick film, sintered palladium adhesive thick film, or transparent conductive oxide such as ITO, and can have a linewidth W between about 0.1 mm and 5 mm. The spacing P of the planar plasma-generating electrode lines of the planar plasma-generating electrode 104 is between about 0.05 mm and 25 mm, but the disclosure is not limited thereto. If a dielectric material is covered on the planar plasma-generating electrode 104, then the forming of filament discharge may be reduced to facilitate even distribution of discharge energy on a flat surface. As a result, the insulating substrate 115 located outside the chamber 102 in the figures may be regarded as a dielectric barrier layer integral with the insulating substrate 115 to achieve the effects above. The ratio of a thickness t of the dielectric material on the planar plasma-generating electrode 104 and the spacing P of the electrode lines also affects the distribution of plasma density. For instance, a dielectric coverage less than a certain thickness (such as t<5 μm or t/P<<1) causes the plasma density to be more concentrated at the center line of the two polarities or right above the electrode lines; and a dielectric coverage over a certain thickness (such as t>100 μm or t/P~1) causes the plasma density to be more even.

The excitation of the plasma is generally done by coupling the planar plasma-generating electrode 104 to a high-frequency oscillation apparatus (not shown) such as audio frequency oscillation apparatus, radio frequency oscillation apparatus, or microwave frequency oscillation apparatus and a corresponding impedance matcher. The AC frequency supplied to the planar plasma-generating electrode 104 during the operation has, for instance, an RF pulse of 1 kHz to 2.45 GHz. In other embodiment, the AC frequency has an RF pulse between 5 kHz and 20 MHz. The RF pulse may be a DC pulse or an AC pulse.

Moreover, in an embodiment of the disclosure, the elevation location (such as the gap spacing between 114 and the electrode 104 of FIG. 1) and the thickness H1 of the planar plasma-generating electrode 114 may be changed by controlling the pressure of the processing inner chamber 110, and a more condensed plasma (generally occurring at a lower a vacuum degree) results in a thinner plasma sheath and the plasma sheath being closer to the surface of the planar plasma-generating electrode 104. Therefore, the treatment range of the planar plasma may be enlarged or shrunk by adjusting the pressure, whereby showing different efficacies at different distances (such as different position in the gap H2 between the sample 116 and the electrode 104 of FIG. 1). The pressure is, for instance, between 0.1 torr and 500 torr.

Figure 2A:
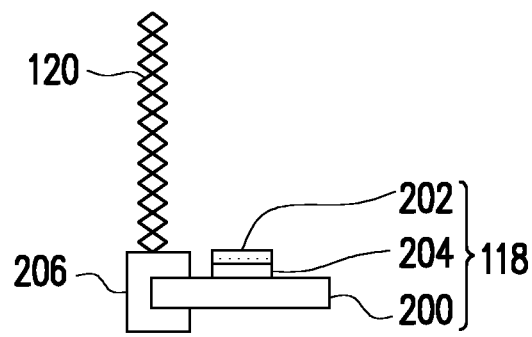
FIG. 2A is a side view of an optical observation system in the plasma treatment apparatus of FIG. 1.
Figure 2B:
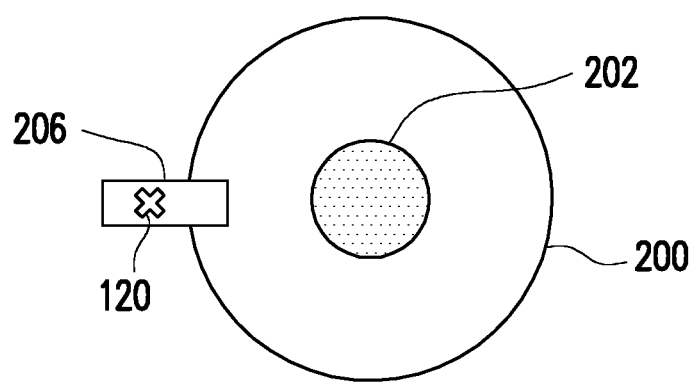
FIG. 2B is a top view of an optical observation system in the plasma treatment apparatus of FIG. 1.

The detailed structure of the optical observation system 108 is as provided in FIG. 2A and FIG. 2B.

FIG. 2A is a side view of an example of an optical observation system. FIG. 2B is a top view of an example of an optical observation system. In FIG. 2A and FIG. 2B, the observation lens 118 includes a transparent substrate 200, a fluorescent coating 202 located on the transparent substrate 200 surface, and a shelter coating 204 between the transparent substrate 200 and the fluorescent coating 202, and the adjustable suspension member 120 and the observation lens 118 are combined by a clamping member 206 between the two. The transparent substrate 200 may be glass. The fluorescent coating 202 is, for instance, made of $Y_2O_3$:Eu red powders or YAG:Ce yellow powders or other visible light fluorescent powders having photoexcitation and electron beam excitation effects. Those powders may be coated in form of particulate film, or they may be coated with an adhesive material such as transparent silicone, transparent epoxy resin, or transparent sol-gel low-temperature sintered glass. The shelter coating 204 is, for instance, an opaque or reflective material such as a metal coating such as copper or aluminum; or a ceramic coating such as aluminum oxide or titanium dioxide. Hereinafter, the process of measuring the planar plasma effective influence region 114 using the observation lens 118 is described.

First, regardless of whether the planar plasma is generated, the observation lens 118 may be moved to the bottom of the processing inner chamber 110 adjacent to the insulating substrate 115 using the adjustable suspension member 120, and then the observation lens 118 is slowly moved upward using the adjustable suspension member 120 when the planar plasma 114 is ignited.

Figures 1, 3A:
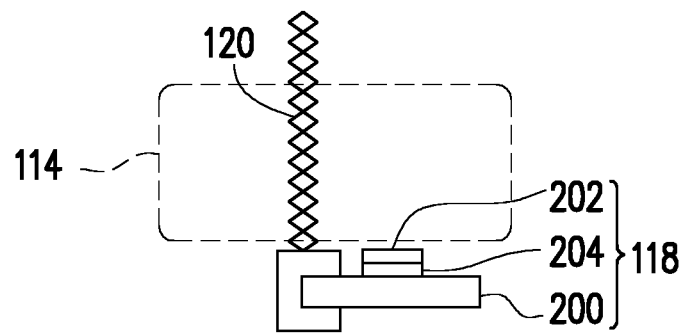
Figures 2, 3A:
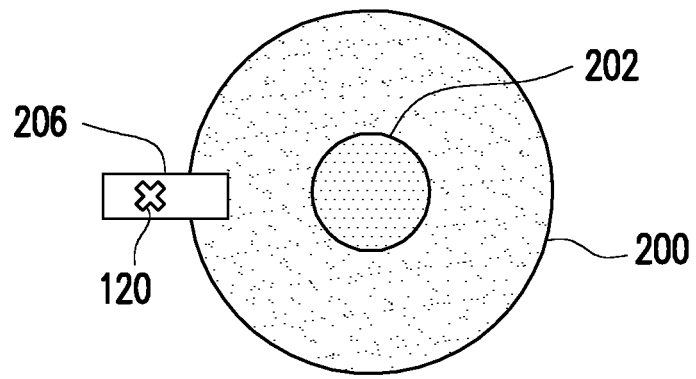

When the observation lens 118 is located in the plasma sheath (dark region) below the effective influence region of the planar plasma effective influence region 114 (side view and top view shown in FIG. 3A-1 and FIG. 3A-2), the fluorescent coating 202 and the transparent substrate 200 both show darker images.

Figures 1, 3B:
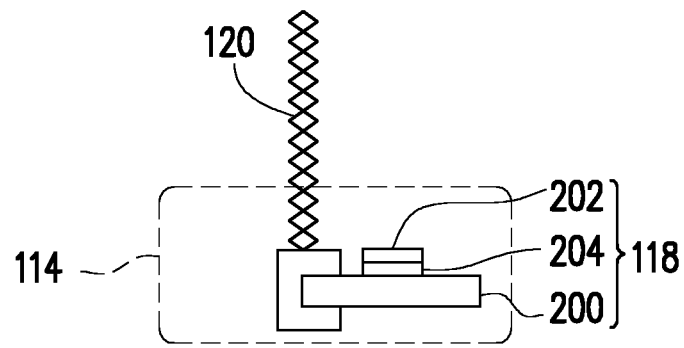
Figures 2, 3B:
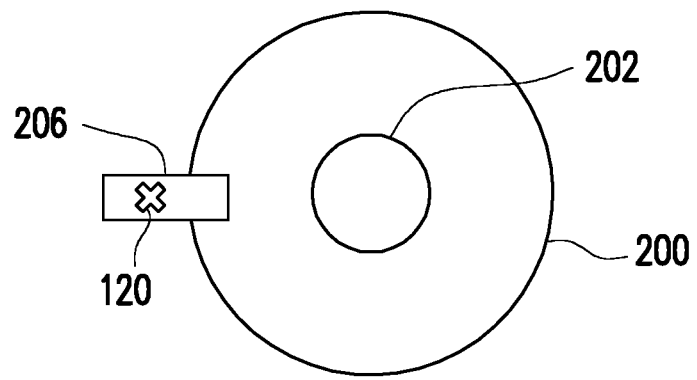

When the observation lens 118 reaches within the range (bright region) of the planar plasma effective influence region 114 (side view and top view shown in FIG. 3B-1 and FIG. 3B-2), the fluorescent coating 202 lights up when excited by the planar plasma 114, and the transparent substrate 200 is also changed into a brighter image.

Figures 1, 3C:
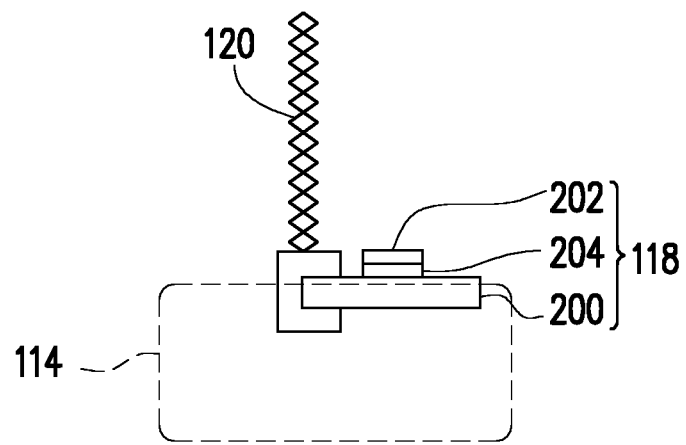
Figures 2, 3C:
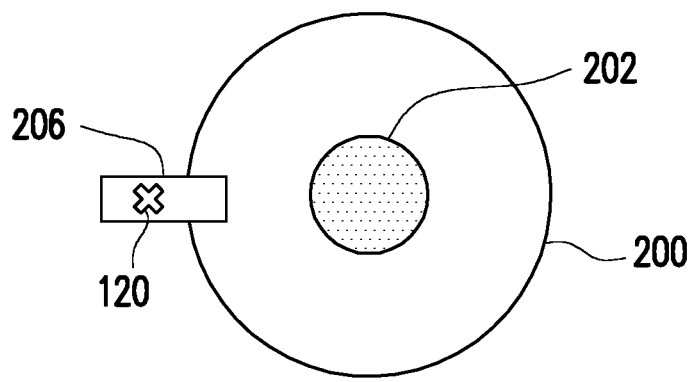

However, when the observation lens 118 is moved outside the planar plasma effective influence region 114 range (side view and top view shown in FIG. 3C-1 and FIG. 3C-2), once the fluorescent coating 202 is moved out of the planar plasma effective influence region 114, since the shelter coating 204 makes the fluorescent coating 202 of the region unable to be excited by the short-wavelength light (i.e., the effective influence region 114) below, the fluorescent coating 202 becomes darker, but significant change does not occur to the brightness of the transparent substrate 200 since the transparent substrate 200 is transparent.

Therefore, the range (i.e., the thickness H1) of the planar plasma effective influence region 114 may be obtained according to the brightness change of the fluorescent coating 202 and the transparent substrate 200 in the observation lens 118. However, the optical observation system of FIG. 2A is only a viable embodiment, and other observation systems similar to the disclosure can also be used.

Figure 4:
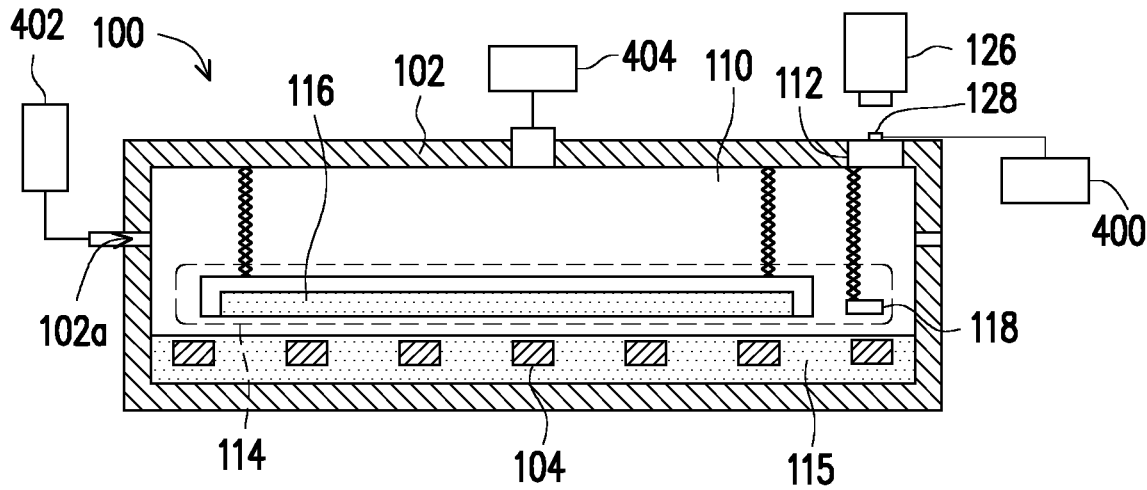
FIG. 4 is an another schematic of plasma treatment apparatus according to the first embodiment.

FIG. 4 is an another schematic of plasma treatment apparatus of the first embodiment, and the same reference numerals as FIG. 1 are used to represent the same or similar components.

The difference between the plasma treatment apparatus 100 of FIG. 4 and FIG. 1 is that, the planar plasma-generating electrode 104 and the insulating substrate 115 are disposed on the inside of the chamber 102, and an external analysis equipment 400 connected to the fiber optic sensor 128, a gas supply apparatus 402 connected to an air inlet 102a, and a pressure control apparatus 404 connected to the chamber 102 for controlling the pressure in the processing inner chamber 110 are further provided. The external analysis equipment 400 is, for instance, a spectrophotometer or a luminance meter for confirming and checking the accuracy of the digital photography apparatus 126. The gas supply apparatus 402 can supply a gas to the chamber 102, and the flow of the gas is, for instance, between 0.5 sccm and 200 sccm, and the gas includes a reactive gas or an inert gas, the inert gas may be helium, neon, argon, nitrogen, or a combination of the above, and the reactive gas is, for instance, oxygen, ammonia, hydrogen, or a combination of the above. If the hydrophobicity of the surface is to be improved, then hydrogen ($H_2$), nitrogen ($N_2$), or a mixture of the above may be used; and if a hydrophilicity treatment is to be performed, then a reactive gas such as oxygen ($O_2$) and a non-reactive gas such as argon (Ar) or helium (He) may be used. The treatment of the reactive gas includes compulsively bonding dissociated gas atoms to the surface of an object, and the non-reactive gas is simply cleaned to leave a large number of dangling bonds, and once returned to the atmosphere, the dangling bonds instantly react with oxygen ($O_2$) or water ($H_2O$) in the air to form a hydrophilic surface rich in oxygen atoms or hydroxyls.

The pressure control apparatus 404 can control the pressure to, for instance, between 0.1 torr and 500 torr so as to adjust the thickness H1 range of the planar plasma effective influence region 114, the range of the plasma sheath without treatment efficacy below, and the "beyond plasma" region above. If the bias on the planar plasma-generating electrode 104 is included, then the electric field for generating the planar plasma may be controlled to be, for instance, 20 kV/cm to 30 kV/cm to change the distribution type of the planar plasma density.

Figure 5:
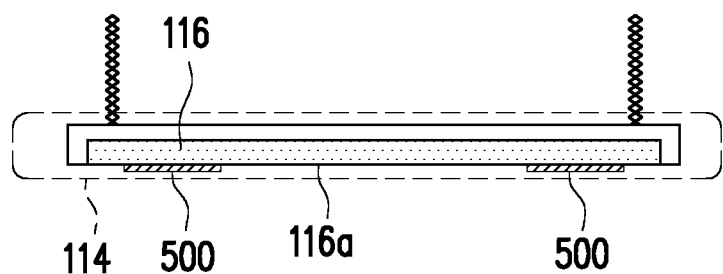
FIG. 5 is a cross section of an example of a sample treatment in FIG. 4.

FIG. 5 is a cross section of an example of a sample treatment in FIG. 4. In FIG. 5, a pattern mask 500 may be disposed in the range of the planar plasma effective influence region 114 close to the surface of the sample 116 to perform a treatment on a predetermined site 116a of the sample 116. The pattern mask 500 only needs to isolate the sample 116 from the planar plasma effective influence region 114, and a contact mask such as photoresist is not needed to complete the plasma treatment of the predetermined site 116a. The pattern mask 500 is, for instance, a release paper.

Figure 6:
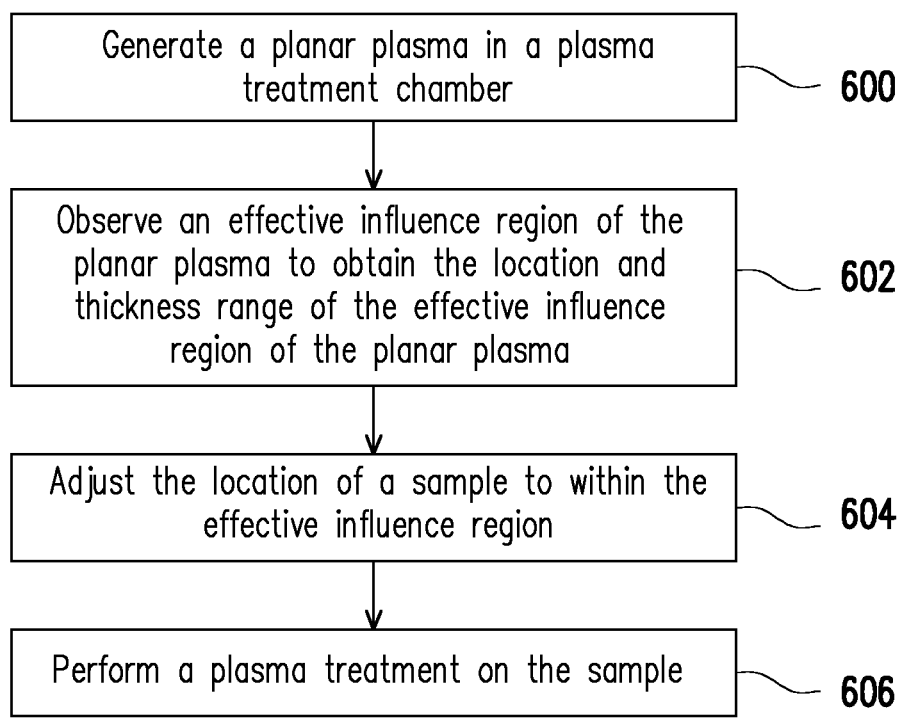
FIG. 6 is a process flow diagram of a plasma treatment according to the second embodiment of the disclosure.

FIG. 6 is a process flow diagram of a plasma treatment according to the second embodiment of the disclosure.

In step 600, a planar plasma is generated in a plasma treatment chamber. In the present embodiment, the electric field generating the planar plasma is, for instance, between 2 kV/cm and 30 kV/cm, and adjusting the electric field of the planar plasma can change the hydrophilicity and hydrophobicity of the surface of the sample. For instance, the surface functional groups of the sample may be removed using the plasma of an inert gas which results in a large number of dangling bonds, and therefore when returned to atmospheric environment, the dangling bonds adsorb oxygen or water so that the sample surface becomes hydrophilic; however, experiments show that, when the electric field strength is less than a certain critical value, the contact angle of the sample surface even exceeds that of the untreated surface, which may be due to the insufficient energy of the plasma to completely remove the surface functional groups on the sample, so that the sample surface becomes more hydrophobic. Therefore, increasing the electric field can change the sample surface to hydrophilic, and if the electric field is reduced, then the sample surface may be more hydrophobic. The gas flowing during the generation of the planar plasma can include a reactive gas or an inert gas, and the inert gas includes helium, neon, argon, nitrogen, or a combination of the above, and the reactive gas includes oxygen, ammonia, hydrogen, or a combination of the above, and the flow of the gas is, for instance, between 0.5 sccm and 200 sccm.

In step 602, the effective influence region of the planar plasma is observed to obtain the location and the thickness range of the effective influence region of the planar plasma. The method of observing the thickness range of the planar plasma effective influence region can include using an optical observation system for measurement. The optical observation system is as shown in FIG. 2A and FIG. 2B and at least includes an adjustable suspension member and an observation lens containing a transparent substrate, a fluorescent coating, and a shelter coating. The brightness change of the fluorescent coating and the transparent substrate is observed by adjusting the location of the observation lens to measure the height range of the planar plasma. The method of observing the brightness change can include visual observation or using a digital photography apparatus, and an external analysis equipment may be used to confirm and check the accuracy of the digital photography apparatus. The thickness range of the planar plasma effective influence region is between about 0.1 mm and 20.0 mm.

Step 604 is performed after step 602 to adjust the location of a sample to within the effective influence region. Next, in step 606, a plasma treatment is performed on the sample. The plasma treatment is, for instance, surface hydrophilicity and hydrophobicity modification, and a mask may be used or the parameters may be adjusted during the process to achieve a patterning effect of hydrophilic and hydrophobic property differentiation. Other plasma treatment operations that can adopt the apparatus of the disclosure are, for instance, surface-activated grafting, surface roughening, compound decomposition reaction, vapor deposition, and dry etching. Before step 604, the range of the planar plasma effective influence region may be adjusted first, such as the thickness of the planar plasma effective influence region and/or the elevation position of the planar plasma effective influence region.

Figure 7:
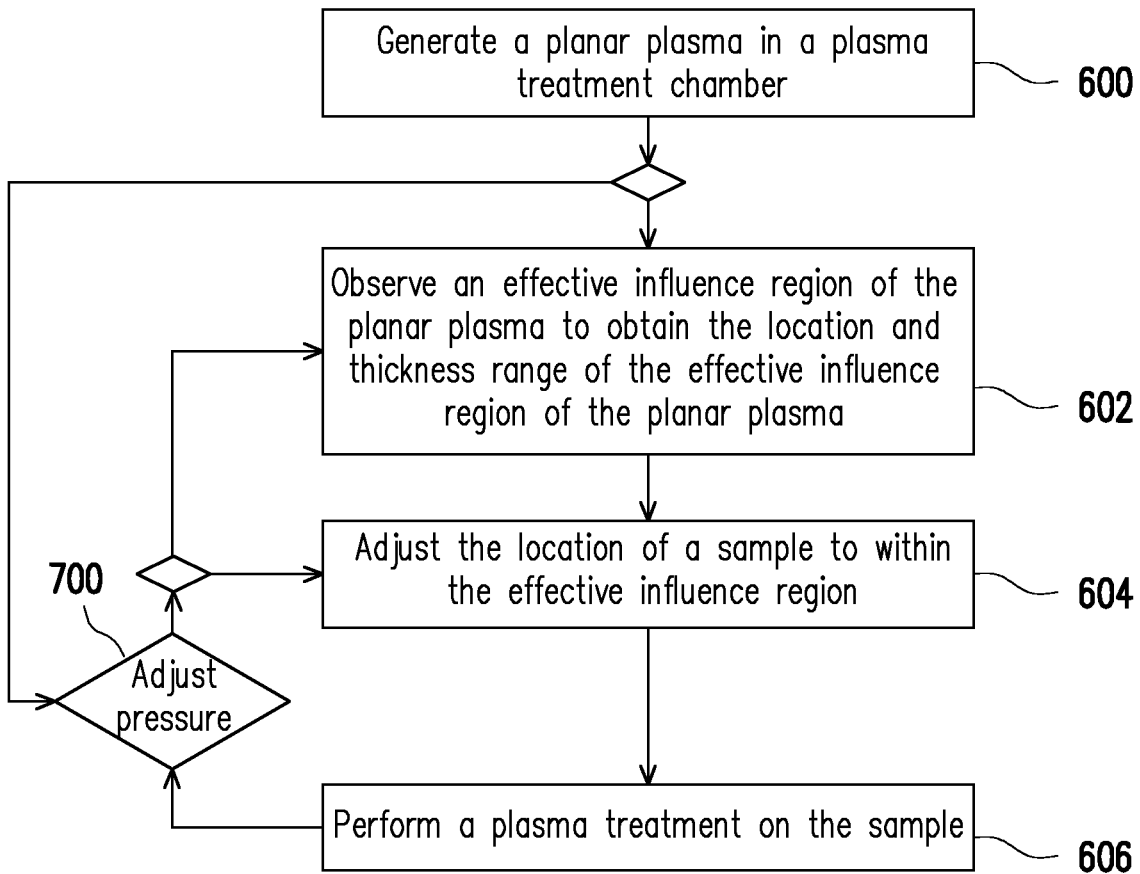
FIG. 7 is a process flow diagram of a plasma treatment according to the third embodiment of the disclosure.

FIG. 7 is a process flow diagram of a plasma treatment according to the third embodiment of the disclosure. The same steps as the second embodiment are used, and therefore steps 600, 602, 604, and 606 of the second embodiment may be referenced directly. The differences between the third embodiment and the second embodiment are described in detail below.

Before step 602, pressure adjustment of step 700 can also be performed first. In step 700, the pressure is, for instance, between 0.1 torr and 500 torr. Via pressure adjustment, the effective influence region of the planar plasma may be changed, such as enlarging or shrinking the effective influence region of the planar plasma. As a result, the effective influence region of the planar plasma may be controlled to be within the desired range, and then step 604 is performed; or after the effective influence region of the planar plasma is changed, step 602 is performed to instantly confirm the thickness range of the planar plasma effective influence region. After step 606 is performed, if a treatment is to be performed on the surface of the sample at different sites, regions, or heights, then step 700 may be repeated to move the planar plasma effective influence region to the surface of the sites, regions, or heights to be treated.

Figure 8:
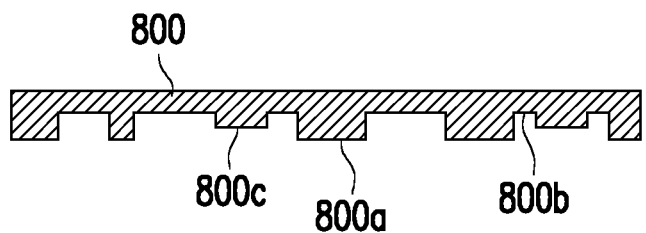
FIG. 8 is a side view of a sample of a plasma treatment process used in the fourth embodiment of the disclosure.
Figure 9A:
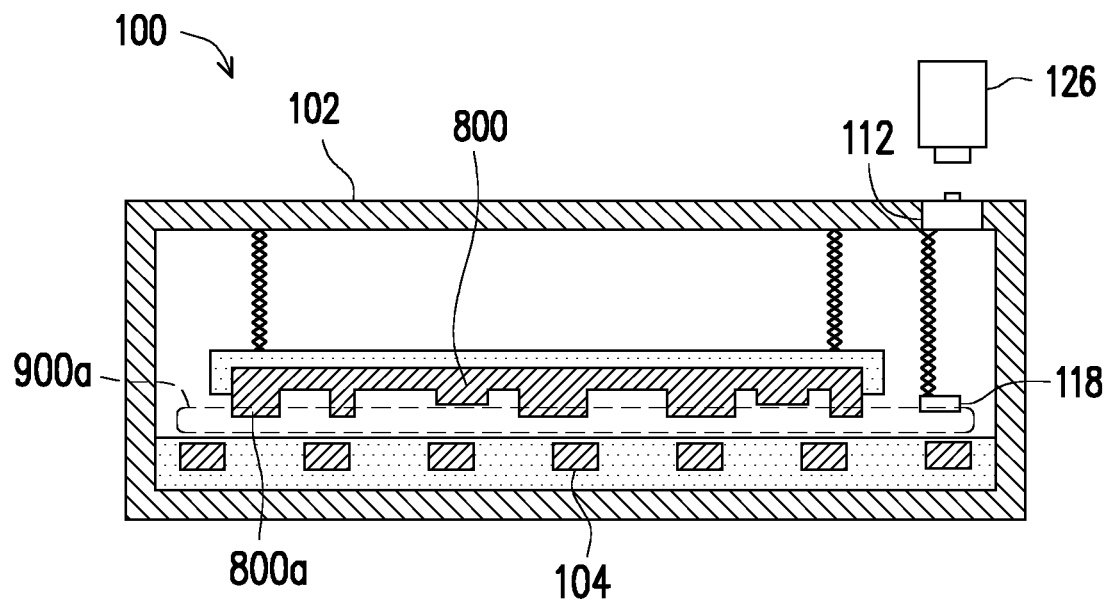
FIG. 9A to FIG. 9C are plasma treatment schematics corresponding to different pressures in the fourth embodiment of the disclosure.
Figure 9B:
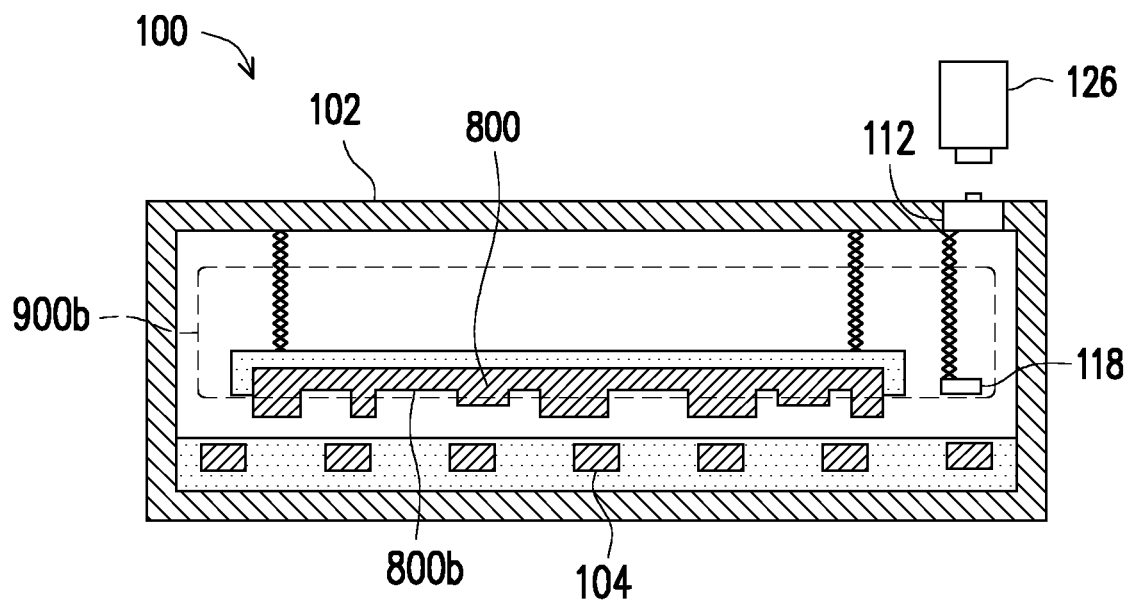
Figure 9C:
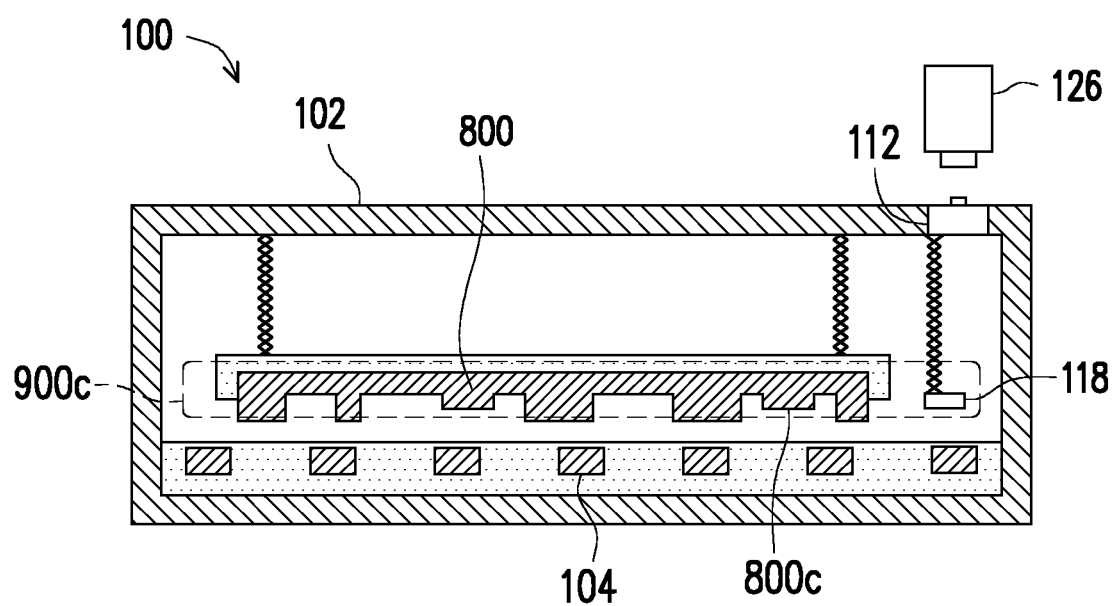

FIG. 8 is a side view of a sample of a plasma treatment process used in the fourth embodiment of the disclosure. FIG. 9A to FIG. 9C are schematics of a plasma treatment performed under different pressures according to the fourth embodiment of the disclosure, and the same reference numerals as FIG. 1 are used to represent the same or similar components.

In FIG. 8, a sample 800 has a 3D surface including three surfaces 800*a*, 800*b*, and 800*c* having different heights to be treated.

It may be seen from FIG. 9A that, the surface 800*a* of the sample 800 to be treated is closest to the planar plasma-generating electrode 104, and when a higher pressure (such as 50 torr to 200 torr) is applied, a flatter condensed planar plasma 900*a* may be obtained, and the location of the planar plasma 900*a* is also lower (such as 0.1 mm to 0.7 mm from the electrode 104), and therefore the observation lens 118 may be aligned with the surface 800*a* to be treated. Next, a step of linking-up observation of the height range of the planar plasma is performed to obtain the effective influence region of the planar plasma 900*a* and to optionally individually treat the pattern of the surface 800*a*.

In FIG. 9B, when a lower pressure (such as 0.1 torr to 1.0 torr) is applied, a diffused planar plasma 900*b* having a greater thickness is obtained, and the location of the planar plasma 900*b* is also higher (such as 1 mm to 3 mm from the electrode 104), and when the observation lens 118 is aligned with the surface 800*b* to be treated, the pattern of the surface 800*b* may be optionally individually treated.

In FIG. 9C, when the pressure is adjusted to the range between FIG. 9A and FIG. 9C (such as 0.2 torr to 20 torr), a condensed planar plasma 900*c* having a certain thickness is obtained, and when the observation lens 118 is aligned with the surface 800*b* to be treated, the patterns of the surfaces 800*b* and 800*c* may be treated at the same time.

Therefore, it may be obtained from the fourth embodiment that, via the adjustment of the gas pressure, the effective influence region of the planar plasma may be changed to treat different regions on the 3D surface.

The application of the fourth embodiment includes, for instance, the multi-metal surface treatment of coins. If a coin (such as copper coin, silver coin, or nickel coin) made by a metal having catalyst properties is used, then the coin may be first entirely provided with a hydrophobic surface using a lower exerted electric field and a more diffused plasma type, and then a pattern surface at a specific height is optionally changed into a hydrophilic surface, and lastly a water-based protective paint is coated. Since only a hydrophilic surface is covered by the protective water-based paint, various treatments of chemical plating are performed after curing to coat other types of metal on other exposed (not covered by the water-based paint) surfaces. That is, coating is optionally performed at different sites for a stainless effect, aesthetics, and to improve the value and texture. The proof of the lower exerted electric field and the conversion to hydrophobic surface is provided in the experimental examples below.

A plurality of experimental examples and comparative examples is provided below to confirm the efficacy of the disclosure, but the scope of the disclosure is not limited to the following content.

Experimental Example 1

An apparatus such as that of FIG. 1 was used, the method of plasma generation was excitation by the dielectric barrier discharge of a coplanar comb-like electrode, and the sample was polyimide (PI) having a thickness of 75 $\mu$m to 100 $\mu$m. A simple oil removal treatment was first performed on the sample before treatment: ultrasonic oscillation was performed in ethanol alcohol for 5 minutes, and then drying was performed in an oven at 60° C.

The sample surface faced the coplanar electrode plate, and the control parameter conditions are as shown below:
buffer gas: argon (Ar);
pressure: about 0.5 torr to 10 torr;
gas flow: about 10 sccm to 50 sccm;
electric field strength: 12 kV/cm;
the sample was about 2 mm from the electrode;
time of plasma treatment time: 0 seconds to 300 seconds.

After the treatment was complete, the sample was left in the atmosphere for 2 minutes and then provided with pure water using a micrometer tip. The water droplets were left on the sample for 10 seconds and then data was recorded. The measurement results of pure water contact angle (CT in degrees) and wetting tension (WT in Nm/m) are respectively shown in FIG. 10A and FIG. 10B.

Figure 10A:
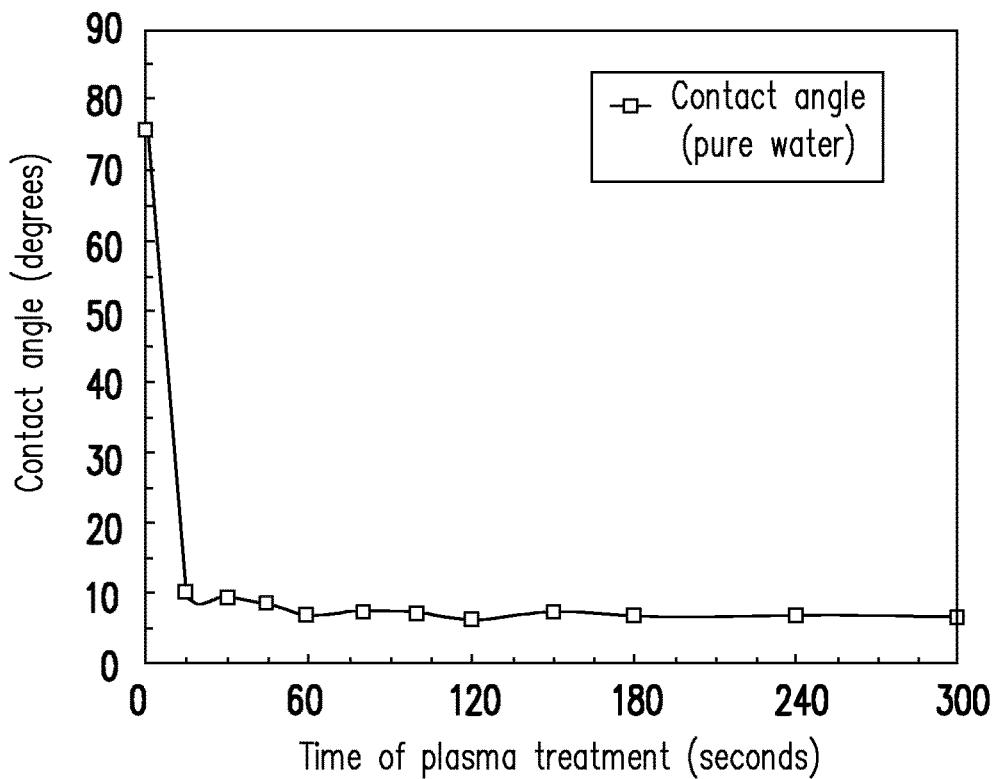
FIG. 10A is a graph of the relationship of contact angle and treatment time of experimental example 1.
Figure 10B:
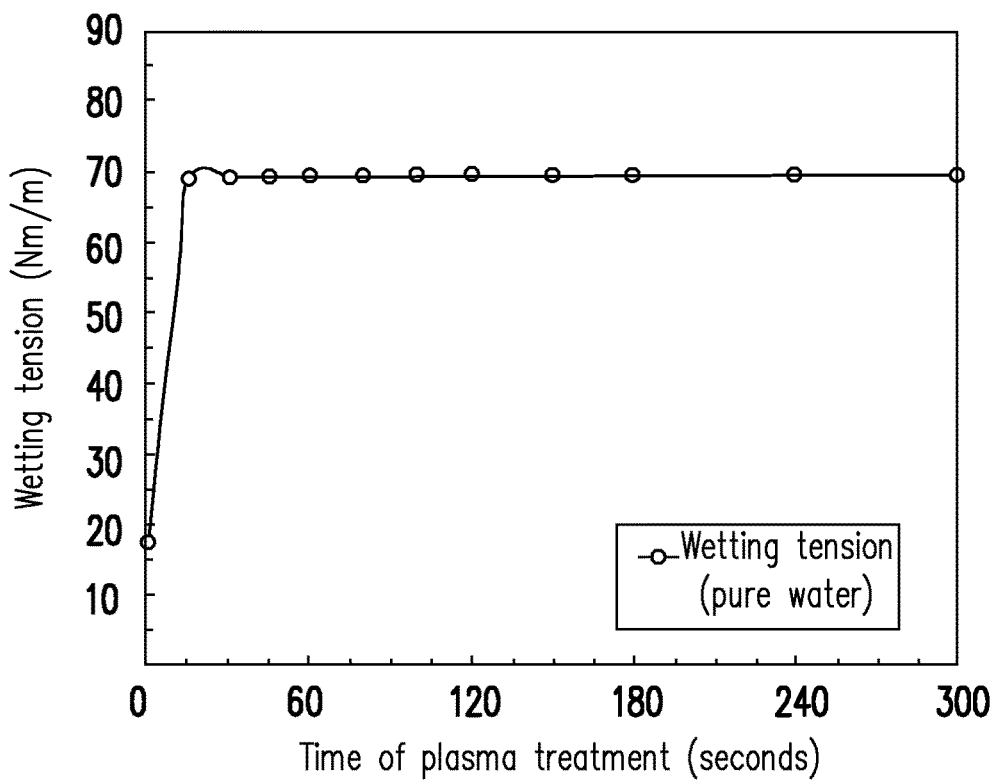
FIG. 10B is a graph of the relationship of wetting tension and treatment time of experimental example 1.

It may be obtained from FIG. 10A and FIG. 10B that, after 15 seconds of treatment, significant effect was observed in that the pure water contact angle was reduced from about 75 degrees to 10 degrees or less, and the pure water wetting tension was rapidly increased more than 4-fold and reached a maximum of about 70 Nm/m.

Experimental Example 2

The same treatment method and checking method as experimental example 1 were used, but the time of plasma treatment was fixed at 120 seconds, and a transformation applied electric field was used instead. The measurement results of pure water contact angle and wetting tension are respectively shown in FIG. 11A and FIG. 11B.

Figure 11A:
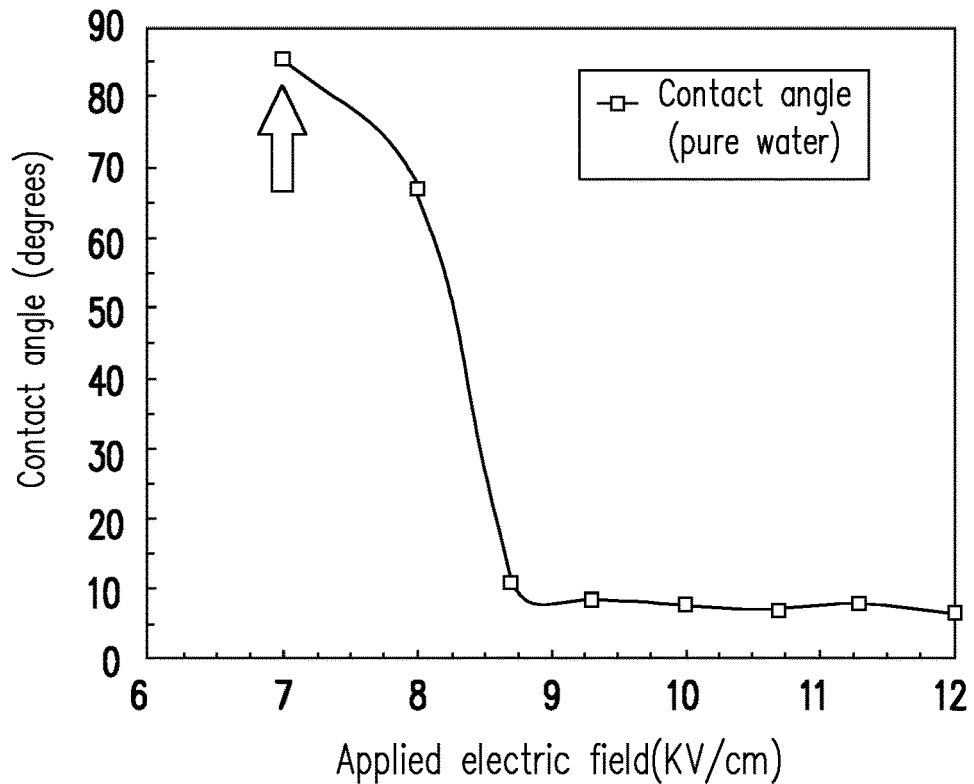
FIG. 11A is a graph of the relationship of contact angle and exerted electric field of experimental example 2.
Figure 11B:
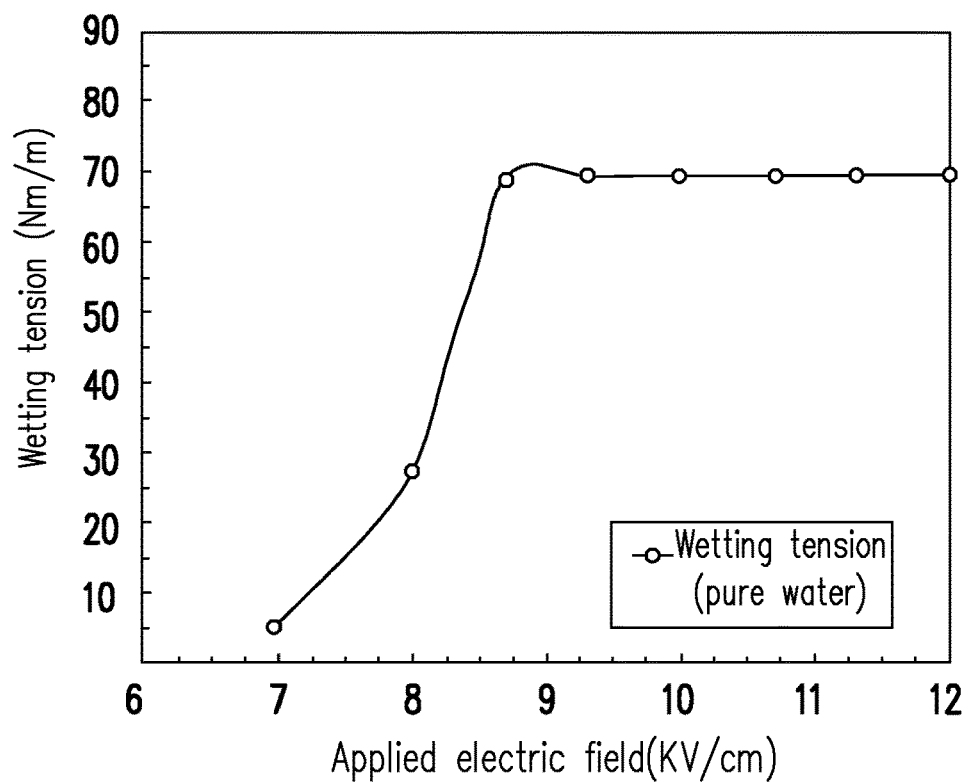
FIG. 11B is a graph of the relationship of wetting tension and exerted electric field of experimental example 2.

It may be obtained from FIG. 11A and FIG. 11B that, when the electric field strength was less than a certain critical value such as 8 kV/cm in the present experimental example, the contact angle of the sample surface even exceeded that of the untreated surface, and therefore in order to make the sample surface hydrophilic, an effective electric field strength had to be >9 kV/cm; and if the sample surface was to be more hydrophobic, then the electric field strength had to be less than 8 kV/cm. The pure water wetting tension was rapidly increased with the increase in electric field and reached a maximum of about 70 Nm/m.

Experimental Example 3

The same treatment method and checking method as experimental example 2 were used, but the distance of the sample from the electrode was changed to 1 mm. The measurement results of contact angle and wetting tension are respectively shown in FIG. 12A and FIG. 12B.

Figure 12A:
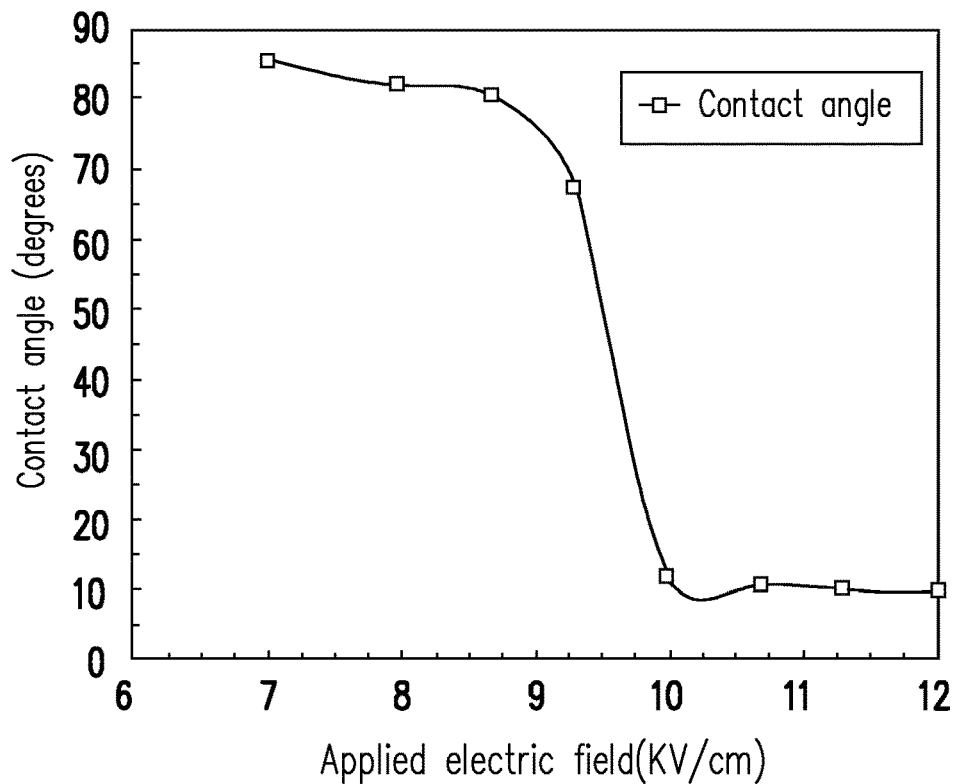
FIG. 12A is a graph of the relationship of contact angle and exerted electric field of experimental example 3.
Figure 12B:
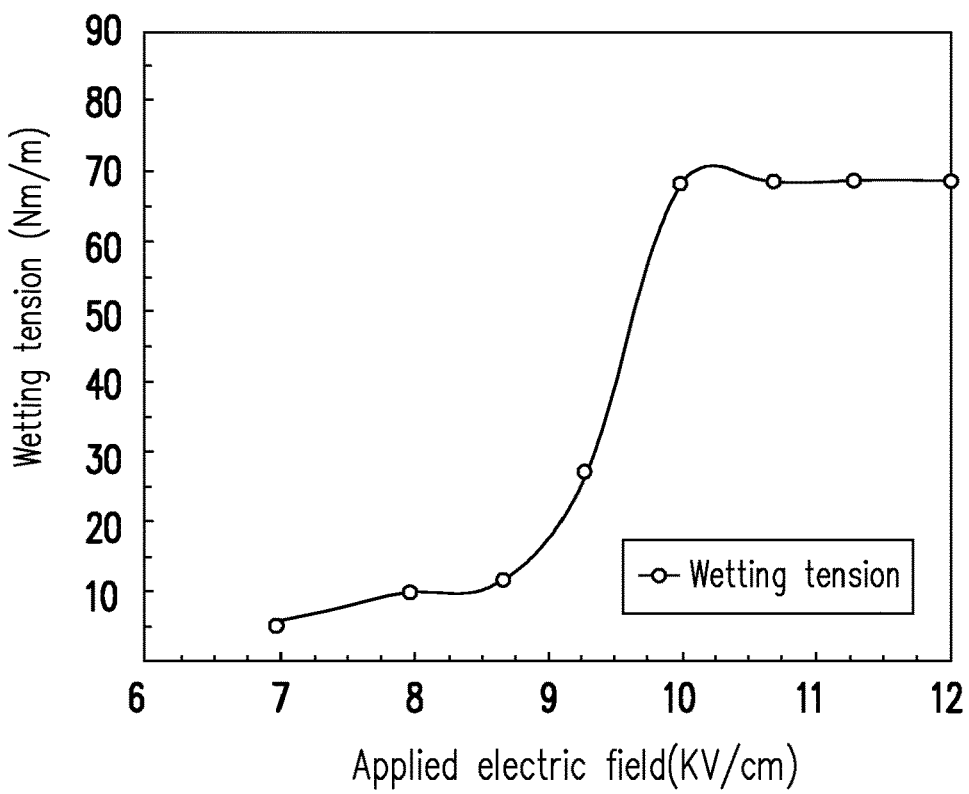
FIG. 12B is a graph of the relationship of wetting tension and exerted electric field of experimental example 3.

It may be obtained from FIG. 12A and FIG. 12B that, when the electric field strength was less than a certain critical value such as 9 kV/cm in the present experimental example, the contact angle of the sample surface even exceeded that of the untreated surface, and therefore in order to make the sample surface hydrophilic, an effective electric field strength had to be >10 kV/cm; and if the sample surface was to be more hydrophobic, then the electric field strength had to be less than 9 kV/cm. However, since the sample was placed near the location of the plasma sheath, worse results than experimental example 2 were obtained under the exact same treatment conditions as experimental example 2. It appears that the critical electric field should be higher to obtain the same treatment effect as experimental example 2.

Moreover, in the three embodiments above, the distance between the sample and the electrode plate (double electrode common plane) was 1 mm to 2 mm, and the phenomenon of plasma etching was not visually observed on the sample surface before and after the treatment.

Experimental Example 4

The same treatment method and checking method as experimental example 2 were used, but the distance of the sample from the electrode was changed to 0.1 mm to 0.2 mm.

The results show that, an effective improvement effect to the hydrophilicity of the sample was not achieved under the same treatment conditions, and this is because the sample was within the range of the plasma sheath.

The gas pressure was increased to greater than 500 torr, and signs of plasma etching occurred on the sample surface. Water droplets were used for testing, and it was discovered that although some of the regions eroded by plasma were hydrophilic, the regions not eroded by plasma still had hydrophobic surface properties. The density of plasma was overly concentrated and was not suitable for non-erosive surface modification. Although the adjustment of the electric field strength could slightly improve the situation, the phenomenon of overly-concentrated plasma density under an excessive gas pressure (such as 500 torr) could not be completely eliminated, i.e., an evenly spread plasma could not be formed.

Experimental Example 5

The sample was changed to regular glass, and the treatment method of experimental examples 2 to 3 was used to obtain a pure water contact angle of about 4 degrees to 5 degrees. That is, the method of removing the surface functional groups of an object by using an inert gas plasma can leave a large number of dangling bonds that adsorbed oxygen or water on the surface of the sample, and thus the treated surface can absorb oxygen or vapor when returned to atmospheric environment. In other words, this surface modification is accomplished by physical adsorption since a chemical reaction was not involved, and therefore this method should be suitable for most object surfaces that do not react at room temperature.

It may be known from experimental example 2 and experimental example 3 that, when the energy of the plasma was insufficient to completely remove the surface functional groups on the sample, the hydrophobicity after the treatment was increased instead of reduced. Based on this feature, a mask was added between the sample and the electrode, or an optional treatment was performed with the elevation present in the plasma effective influence region.

Experimental Example 6

A release paper was cut to form parallel trenches, and then it was adhered to the surface of a PI sample. After the treatment method of experimental example 2, the sample was immediately placed in a tin palladium colloidal solution to be soaked for 15 minutes so that catalyst metal particles could be adsorbed to the hydrophilic portions. After the PI sample was cleaned and dried, the PI sample was soaked in an electroless copper plating solution for 5 minutes. It may be confirmed by observation that, since the portions covered by the release paper were more hydrophobic, tin palladium colloids could not be adsorbed at all, and deposition of copper did not occur in the end; on the other hand, the portions exposed to the plasma from the trenches had significant deposition of copper.

Experimental Example 7

An inorganic salt containing silver (Ag) was used in a solution of ethanol as a precursor at a concentration of 0.05 M. Upon visual observation, wetting could not occur on the untreated PI sample surface, the phenomenon of clumping and aggregation occurred, and no adhesion occurred after spin coating.

The same precursor was spin coated on the sample obtained from the treatment of embodiment 1, and visual observation confirmed that the precursor was evenly adhered.

The two samples were baked in an oven at 100° C. for 30 minutes, and after thermal decomposition conversion was performed, the samples were dipped in an electroless copper plating solution for 5 minutes.

Via visual observation, the untreated PI sample was confirmed to be absent from any signs of coppering, and the sample obtained from the treatment of embodiment 1 was completely covered with copper.

Moreover, a stamp was dipped into the precursor followed by imprinting on another sample obtained from the treatment of experimental example 1, and then thermal conversion and chemical plating were performed. A same copper pattern as the stamp pattern could be reproduced on the sample via visual observation.

Based on the above, in the disclosure, when planar plasma is generated, the thickness range of the planar plasma effective influence region may be obtained by an optical observation system at the same time, and therefore a rapid and effective treatment may be generated on the sample surface within the thickness range, such as a technique of surface modification (functional group modification). Therefore, the disclosure is different from the treatment of entirely immersing the substrate in gaseous plasma, and the treatment surface of the disclosure may be selected, or a mask may be added to only modify some of the regions to achieve the patterning effect of hydrophilicity and hydrophobicity property differentiation. As a result, not only can time and resources be saved, the usage of plasma energy is also more effective.

It will be apparent to those skilled in the art that various modifications and variations may be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A plasma treatment method, comprising:
generating a planar plasma in a plasma treatment chamber;
observing an effective influence region of the planar plasma by using an optical observation system, wherein the optical observation system comprises an observation lens, and the observation lens comprises a transparent substrate, a fluorescent coating located on a surface of the transparent substrate, and a shelter coating between the transparent substrate and the fluorescent coating;
adjusting a location of the observation lens to observe a brightness change of the fluorescent coating and the transparent substrate for obtaining a location and a thickness range of the effective influence region of the planar plasma;
adjusting a location of a sample to within the effective influence region; and
performing a plasma treatment on the sample.

2. The plasma treatment method of claim 1, further comprising, before adjusting the location of the sample, adjusting a thickness and the location of the effective influence region of the planar plasma.

3. The plasma treatment method of claim 1, wherein the step of observing the brightness change of the fluorescent coating and the transparent substrate comprises a visual observation or using a digital camera.

4. The plasma treatment method of claim 3, further comprising using an external analysis equipment to confirm and check an accuracy of the digital camera.

5. The plasma treatment method of claim 1, wherein the sample has a 3D surface, and the effective influence region of the planar plasma is changed by adjusting a pressure to process different regions on the 3D surface.

6. The plasma treatment method of claim 1, further comprising, after generating the planar plasma, enlarging or shrinking the effective influence region of the planar plasma by adjusting a pressure.

7. The plasma treatment method of claim 6, wherein the pressure is between 0.1 torr and 500 torr.

8. The plasma treatment method of claim 1, wherein a gas flowing while generating the planar plasma comprises a reactive gas or an inert gas.

9. The plasma treatment method of claim 8, wherein the inert gas comprises helium, neon, argon, nitrogen, or a combination thereof, and the reactive gas comprises oxygen, ammonia, hydrogen, or a combination thereof.

10. The plasma treatment method of claim 8, wherein a flow of the gas is between 0.5 sccm and 200 sccm.

11. The plasma treatment method of claim 1, wherein the thickness range of the effective influence region of the planar plasma is between 0.1 mm and 20.0 mm.

12. The plasma treatment method of claim 1, wherein an electric field for generating the planar plasma is between 2 kV/cm and 30 kV/cm.

13. The plasma treatment method of claim 1, further comprising, before performing the plasma treatment, adjusting an electric field of the planar plasma to change a hydrophilicity and a hydrophobicity of a surface of the sample.

14. The plasma treatment method of claim 1, further comprising disposing a pattern mask on a surface of the sample to perform the plasma treatment on a predetermined site of the sample.

* * * * *